United States Patent
Yao et al.

(10) Patent No.: US 11,342,827 B2
(45) Date of Patent: May 24, 2022

(54) FOUR-SIDED-SYNCHRONOUS-SWING DUAL-MODE BROADBAND POWER GENERATION DEVICE

(71) Applicant: Tiangong University, Tianjin (CN)

(72) Inventors: Minghui Yao, Tianjin (CN); Pengfei Liu, Tianjin (CN); li Ma, Beijing (CN); Wei Xia, Beijing (CN)

(73) Assignee: TIANGONG UNIVERSITY, Tianjin (CN)

( * ) Notice: Subject to any disclaimer, the term of this patent is extended or adjusted under 35 U.S.C. 154(b) by 282 days.

(21) Appl. No.: 16/642,351

(22) PCT Filed: Feb. 7, 2018

(86) PCT No.: PCT/CN2018/075619
§ 371 (c)(1),
(2) Date: Feb. 26, 2020

(87) PCT Pub. No.: WO2019/041757
PCT Pub. Date: Mar. 7, 2019

(65) Prior Publication Data
US 2020/0313532 A1    Oct. 1, 2020

(30) Foreign Application Priority Data
Aug. 28, 2017   (CN) .......................... 201710750235.6

(51) Int. Cl.
*H02N 2/18*      (2006.01)
*H02K 35/02*     (2006.01)

(52) U.S. Cl.
CPC ............. *H02K 35/02* (2013.01); *H02N 2/186* (2013.01)

(58) Field of Classification Search
CPC .......... H02N 2/00; H02N 2/186; H02N 2/188; H02K 35/02; B81B 3/0097; B81B 7/00;
(Continued)

(56) References Cited

U.S. PATENT DOCUMENTS

| 8,796,907 | B2 * | 8/2014 | Galchev ................. | H02N 2/186 |
| | | | | 310/339 |
| 2007/0007827 | A1 * | 1/2007 | Harris .................... | H02K 35/04 |
| | | | | 310/15 |

(Continued)

FOREIGN PATENT DOCUMENTS

| AU | 2015208446 B2 * | 11/2018 | ............. H02N 2/186 |
| CN | 203896222 U | 10/2014 | |

(Continued)

*Primary Examiner* — Maged M Almawri
(74) *Attorney, Agent, or Firm* — Leonid Kisselev

(57) ABSTRACT

A four-sided-synchronous-swing dual-mode broadband power generation device, comprising a fixing frame, a piezoelectric beam swing mechanism, and electromagnetic induction power generators (7). Four groups of straight piezoelectric beams (6) and L-shaped piezoelectric beams (5) are installed in a small space, therefore, a limited working space can be fully utilized, the working area can be reduced, and the requirements for development of a microelectromechanical system can be satisfied. Each L-shaped piezoelectric beam (5) comprises a horizontal beam and a vertical beam, so that vibration in two directions can be implemented, therefore, the dynamic behavior of piezoelectric cantilevers is enriched, and the power generation efficiency of the system is improved. The straight piezoelectric beams (6) and L-shaped piezoelectric beams (5) have different lengths, so that energy of different swing frequencies can be effectively harvested, and the effective working frequency bandwidth can be broadened. The adjacent straight piezoelectric beams (6), L-shaped piezoelectric beams (5), and electromagnetic induction power generators (7) constitute four groups of dual-mode piezoelectric electromagnetic composite power generation structures, effectively improving power generation. The four-sided-synchronous-swing dual-mode broadband power generation device can harvest energy inputted in the form of rotation from (Continued)

environment and currently can be applied to wind power generation, hydroelectric power generation, bicycle self-power supply, and other fields.

4 Claims, 6 Drawing Sheets

(58) Field of Classification Search
CPC ... B81B 7/0003; B81B 7/0022; B81B 7/0016; B81B 7/0045; B81B 7/0058; B81B 7/0074; B81B 2201/014; B81B 2203/0118; B81B 2203/00; B81B 2203/01; B81B 2203/0307; H01H 59/0009
USPC ......... 310/309, 308, 311, 312–317; 333/101, 333/105, 262, 336, 108; 335/78; 200/181
See application file for complete search history.

(56) References Cited

U.S. PATENT DOCUMENTS

| | | | | |
|---|---|---|---|---|
| 2008/0143196 | A1* | 6/2008 | Sprague | G02B 26/0858 310/36 |
| 2009/0256297 | A1* | 10/2009 | Geisberger | G01P 15/125 267/160 |
| 2009/0261689 | A1* | 10/2009 | Fang | H02K 53/00 310/319 |
| 2009/0322184 | A1* | 12/2009 | Carman | H02N 2/186 310/339 |
| 2010/0060107 | A1* | 3/2010 | Seki | H02N 2/0055 310/323.16 |
| 2010/0180456 | A1* | 7/2010 | Laabs | G01C 1/02 33/281 |
| 2010/0187917 | A1* | 7/2010 | Zhu | G03F 7/70725 310/12.06 |
| 2010/0219722 | A1* | 9/2010 | Onishi | G10K 9/122 310/348 |
| 2014/0125204 | A1* | 5/2014 | Matsuda | H01L 41/1871 310/365 |
| 2014/0152134 | A1* | 6/2014 | Heo | H02K 21/00 310/152 |
| 2014/0184024 | A1* | 7/2014 | Loverich | H02N 2/188 310/328 |
| 2014/0240810 | A1* | 8/2014 | Sapir | G02B 26/0833 359/221.2 |
| 2015/0130956 | A1* | 5/2015 | Ohashi | G02B 27/64 348/208.11 |
| 2015/0180375 | A1* | 6/2015 | Kleipa | H02N 2/18 310/339 |
| 2016/0079886 | A1* | 3/2016 | Hasegawa | H02N 2/181 73/865.8 |

FOREIGN PATENT DOCUMENTS

| | | | |
|---|---|---|---|
| CN | 104821743 | A | 8/2015 |
| CN | 205249087 | * | 5/2016 |
| CN | 205249087 | U | 5/2016 |
| CN | 206370787 | U | 8/2017 |
| CN | 107359826 | B | 11/2017 |

* cited by examiner

FOUR-SIDED-SYNCHRONOUS-SWING DUAL-MODE BROADBAND POWER GENERATION DEVICE

CROSS REFERENCE TO RELATED APPLICATION

This application is a national stage application of International application number PCT/CN2018/075619, filed Feb. 7, 2018, titled "FOUR-SIDED-SYNCHRONOUS-SWING DUAL-MODE BROADBAND POWER GENERATION DEVICE," which claims the priority benefit of Chinese Patent Application No. 201710750235.6, filed on Aug. 28, 2017, the content of which is hereby incorporated by reference in its entirety.

TECHNICAL FIELD

The invention relates to a four-sided-synchronous-swing dual-mode broadband power generation device, which can effectively collect energy input in a rotating form from environment. The invention belongs to the field of piezoelectric power generation and renewable environmental protection.

BACKGROUND

With the emergence of various new wireless low-power components and people's increasing attention to living environment, more and more research have focused on energy harvesting technology that can be used to convert energy in the surrounding environment into electrical energy storage, and on new-types of energy harvesters that can supply power to low-power devices. At present, the commonly used energy harvesting methods are electromagnetic and piezoelectric, both acquisition methods are green new energy sources. The combination of the two acquisition methods would convert the energy of external vibration into electrical energy, which can improve the efficiency of energy collection and poses no pollution to the environment. The current invention provides a novel combination of a piezoelectric type and an electromagnetic type power generating device, which can receive energy input from the environment in a rotating form, and convert the output into a swing form through the crank rocker mechanism, to deform a vibrating piezoelectric cantilever beam to generate electricity. At the same time, vibration of the piezoelectric cantilever beam will drive a magnet inside an electromagnetic induction coil to move, causing the magnetic flux passing through the coil to change continuously, thereby generating an induced electromotive force. The invention reduces the working space through a novel layout mode, and conforms to the development of micro-electromechanical system (MEMS) system. The piezoelectric cantilever beam structure and the layout disclosed in this invention can broaden the effective working bandwidth of the system, and the power generation of the system is effectively increased by combining the two modes of energy harvesting.

SUMMARY

The object of the present invention is to provide a four-sided-synchronous-swing dual-mode broadband power generation device, which combines four sets of piezoelectric type and electromagnetic power generation to improve power generation capability. The layout of the structure takes advantage of the limited workspace and meets with the development of MEMS (micro-electromechanical system). At present, most piezoelectric energy harvesters use vibration energy in the environment to generate electricity. The present invention proposes an energy harvester that uses rotating energy in the environment to generate electricity. Four sets of piezoelectric cantilever power generation devices and four sets of electromagnetic induction power generation devices are introduced in a small working space. Combination of piezoelectric power generation and electromagnetic power generation effectively improves the power generation effect of the system. Rotational form of the input end is converted into an oscillating form by the crank rocker mechanism 2. When the input end rotates at a high speed, the four sets of gear shafts 3 are oscillated at a high frequency, so that the piezoelectric cantilever beam is oscillated at a high frequency, and the piezoelectric beam is deformed, thereby generating electricity by using the positive piezoelectric effect of piezoelectric material. When the piezoelectric cantilever beam is swung to the horizontal position, the spring end magnet 21 is repelled by the straight beam end magnet 26 and L beam magnet a 27 to perform a reciprocating stretching motion, magnetic flux passing through the coil 18 will change to generate an induced electromotive force. The present invention can be applied to fields in which wind energy, hydroelectric power, and bicycle self-power supply are input in a rotational form. When rotational speed of the input end is high, the piezoelectric cantilever beam performs a high-frequency large-value swing, which effectively improves the efficiency of energy collection. When rotational speed of the input end is low, since the straight beam end magnet 26, L beam magnet a 27, L beam magnet b 28 and spring end magnet 21 and the center magnet 22 repel each other, the piezoelectric beam also has a large deformation, and PZT (lead zirconate titanate (Pb[Zr(x)Ti(1-x)]O3)) piezoelectric beam has a high electromechanical coupling coefficient and will still maintain a good power generation effect.

In order to achieve the above technical object, the technical solution adopted by the present invention is: A four-sided-synchronous-swing dual-mode broadband power generation device, which is composed of a fixed frame, a piezoelectric beam swinging mechanism and an electromagnetic induction power generating device 7.

The fixed frame is composed of a base 1, a lifting support frame 29, an electromagnetic induction power generation device support frame 12, and a center magnet fixing platform 30 with a center magnet 22.

The lifting support frame 29 is composed of a support gear shaft 3 and a support input shaft 31. The support gear shaft 3 is composed of a lifting platform 10 and a bottom platform connector 11, and the bottom platform connectors 11 are respectively mounted on the four corner of the base 1. The lifting platform 10 is fixed to the bottom platform connector 11 by bolts. The lifting platform 10 and the bottom platform connector 11 have a first through slot, distance between the lifting platform 10 and base 1, lifting platform 10 and central magnet 22 is adjusted via the first through slot to install piezoelectric cantilevers of different sizes and adjust the amplitude of the piezoelectric cantilever beam swing. The support input shaft 31 is composed of a rotating shaft support platform 13 and a rotating shaft lifting platform 14, rotating shaft supporting platform 13 is fixed to rotating shaft lifting platform 14 by bolts. Rotating shaft support platform 13 and rotating shaft lifting platform 14 have second through slot, the distance between rotating shaft lifting platform 14 and base 1 is adjusted via the second through slot.

The bottom platform connector 11 and base 1, rotating shaft support platform 13 and the base 1 are both fixed by bolts.

The lifting platform 10, rotating shaft lifting platform 14 and bearing 9 are connected by bolts.

Electromagnetic induction power generation device support frame 12 is composed of a sleeve pressing piece 15, a sleeve lifting bracket 16, and an electromagnetic induction power generating device fixing bracket 17. The electromagnetic induction power generation device fixing bracket 17 and base 1 are fixed by bolts. The sleeve lifting bracket 16 and electromagnetic induction power generating device fixing bracket 17 have a third through slot and are fixed by bolts. The sleeve lifting bracket 16 can slide on electromagnetic induction power generating device fixing bracket 17. The heights of spring end magnet 21, end magnet 26 and L beam magnet a 27 are the maintained same. The sleeve lifting bracket 16 and sleeve pressing piece 15 are connected by bolts and clamp the sleeve 19.

Central magnet fixing platform 30 and base 1 are fixed by bolts. The height of the center magnet 22 is adjusted by adding a spacer. The piezoelectric beam swinging mechanism is composed of a crank rocker mechanism 2, a piezoelectric beam component, a bearing 9, and a gear component. The crank rocker mechanism 2 is composed of a crank 32, a link 33 and a rocker 34. The crank 32 is coupled to the gear shaft 3, and the rocker 34 is coupled to the input shaft 31. The crank 32 and one end of the link 33, the other end of the link 33 and the rocker 34 are both connected by bolt sleeves 35. The crank rocker mechanism 2 converts rotation of the input shaft 31 into the swing of gear shaft 3, thereby causing the piezoelectric cantilever to vibrate. Piezoelectric beam component is composed of a piezoelectric beam clamp, a straight piezoelectric beam 6, an L-shaped piezoelectric beam 5, and a permanent magnet. The piezoelectric beam clamp is composed of a piezoelectric beam clamp upper clamp plate 23, a piezoelectric beam clamp lower clamp plate 24, and a piezoelectric beam clamp 25. The piezoelectric beam clamp upper plate 23 and the piezoelectric beam clamp lower clamp plate 24 are bolted and fixed to the gear shaft 3, piezoelectric beam clamp upper clamp plate 23 and the piezoelectric beam clamp lower clamp plate 24 can be swung together with the gear shaft 3. The piezoelectric beam clip 25 is connected to the piezoelectric beam clamp lower clamp plate 24 by a bolt for clamping the piezoelectric cantilever beam. The permanent magnet includes a straight beam end magnet 26, an L beam magnet a 27, and an L beam magnet b 28. The permanent magnet is bonded to the piezoelectric cantilever beam to reduce the natural frequency of piezoelectric cantilever beam and increase the amplitude of piezoelectric cantilever beam, thereby improving the power generation capability of the system. Bearing 9 connects the gear shaft 3 and the input shaft 31, effectively reducing the resistance of the gear shaft 3 and the input shaft 31 when rotating, and reducing energy loss. Bearing 9 is connected to the lifting platform 10 and the rotating shaft lifting platform 14 by bolts. Gear component is composed of a gear shaft 3 and a bevel gear 4. Gear shaft 3 and bevel gear 4 are connected by a key, and gear shaft 3 is mounted on lifting platform 10 via bearing 9. The four gear shafts 3 connected to the crank 32 are all swung with the crank 32. The electromagnetic induction power generating device 7 is composed of a coil 18, a sleeve 19, a spring 20, and a spring end magnet 21. The sleeve 19 is fixed to the sleeve lifting bracket 16 by sleeve pressing piece 15. The intermediate portion of the spring 20 is fixed to the inner wall of sleeve 19. The spring end magnet 21 is bonded and fixed to both ends of spring 20. The spring end magnet 21 is repelled by straight beam end magnet 26 and L beam magnet a 27, and reciprocates inside sleeve 19, and magnetic flux passing through the coil 18 constantly changes, thereby generating an induced electromotive force.

The base material of L-shaped piezoelectric beam 5 and straight piezoelectric beam 6 is brass, and the piezoelectric layer material is PZT.

The electrical energy generated by vibration of each piezoelectric cantilever beam is drawn through two wires, one wire connected to the brass layer and the other wire connected to the PZT piezoelectric layer.

The coil 18 is a copper enameled wire.

Most of the current piezoelectric cantilever power generation technologies generate electricity by utilizing vibrations in the environment. Compared with the prior art, the invention can collect energy input in a rotating form in the environment. The invention introduces four sets of piezoelectric electromagnetic composite power generation structures in a small working space, adopts an innovative layout mode, fully utilizes a limited working space, and conforms to the development trend of MEMS technology. The invention adopts a combination of piezoelectric and electromagnetic power generation technologies to improve the power generation capability of the structure. The lengths of the straight piezoelectric beam 6 and the L-shaped piezoelectric beam 5 are different, and the energy of different oscillation frequencies can be effectively collected, the effective working bandwidth is broadened. Still other embodiments of the present invention will become readily apparent to those skilled in the art from the following detailed description, wherein is described embodiments of the invention by way of illustrating the best mode contemplated for carrying out the invention. As will be realized, the invention is capable of other and different embodiments and its several details are capable of modifications in various obvious respects, all without departing from the spirit and the scope of the present invention. Accordingly, the drawings and detailed description are to be regarded as illustrative in nature and not as restrictive.

BRIEF DESCRIPTION OF THE DRAWINGS

The invention may best be understood by referring to the following description and accompanying drawings that are used to illustrate embodiments of the invention. The invention is illustrated by ways of example in the embodiments and it not limited in the figures of the accompanying drawings, in which like references indicates similar elements.

The numbers and corresponding names in the figure are: 1—base, 2—crank rocker mechanism, 3—gear shaft, 4—bevel gear, 5—L type piezoelectric beam, 6—straight piezoelectric beam, 7—electromagnetic induction generator, 8—piezoelectric Beam clamp, 9—bearing, 10—lift platform, 11—bottom platform connector, 12—electromagnetic induction generator support frame, 13—rotary shaft support platform, 14—rotary shaft lifting platform, 15—sleeve pressing piece, 16—sleeve lifting bracket, 17—electromagnetic induction generator fixing bracket, 18—coil, 19—sleeve, 20—spring, 21—spring end magnet, 22—center magnet, 23—piezoelectric beam clamp, 24—piezoelectric beam clamp lower plate, 25—piezoelectric beam clip, 26—straight beam end magnet, 27—L beam magnet a, 28—L beam magnet b, 29—lifting support frame, 30—center magnet fixed platform, 31—Input shaft, 32—crank, 33—link, 34—rocker, 35—bolt sleeve.

DETAILED DESCRIPTION OF THE PREFERRED EMBODIMENTS

The invention is further described in detail in combination with the preferred embodiments.

Figure 1:
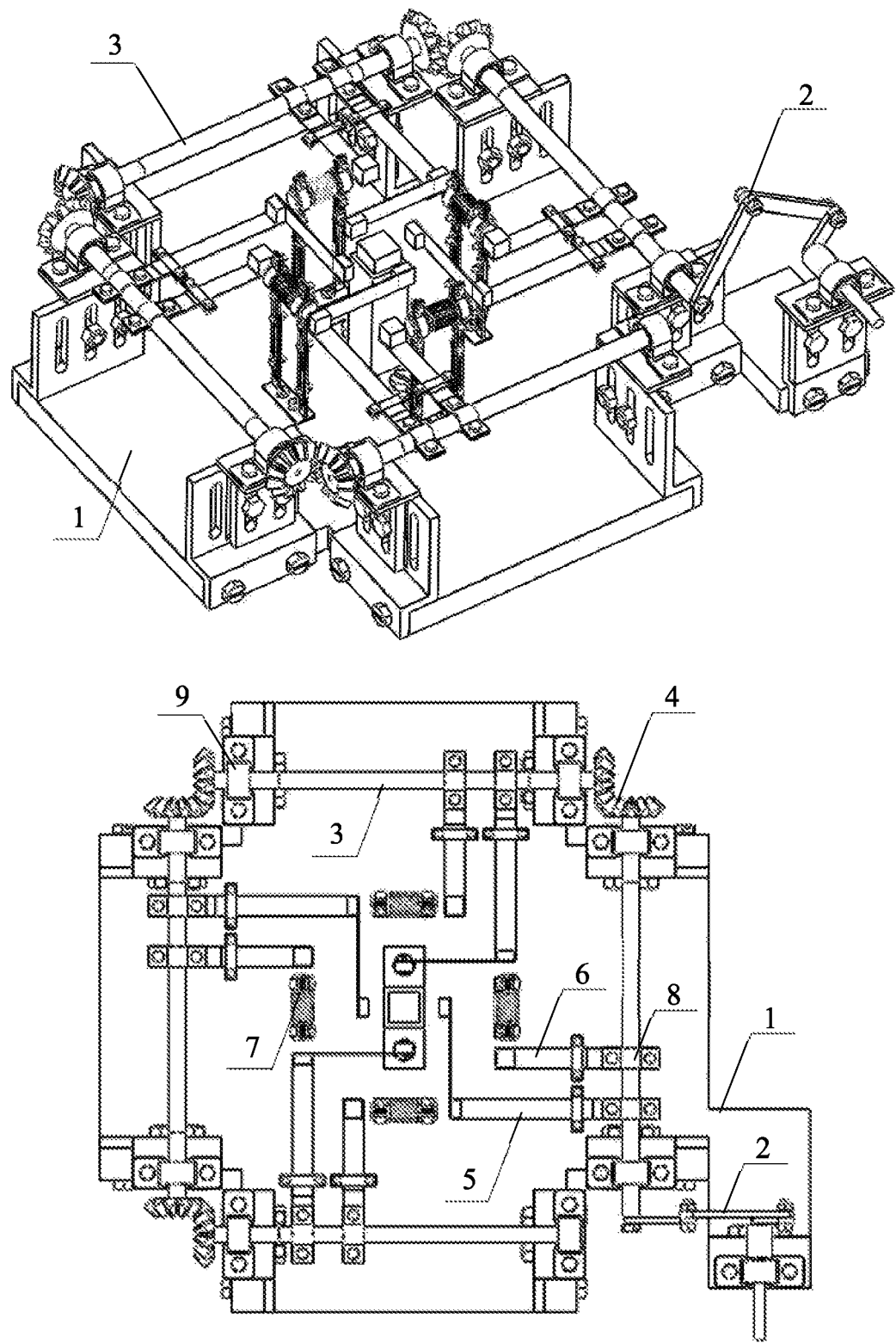
FIG. 1 is a schematic overall structural view and a plan view of a four-sided-synchronous-swing dual-mode broadband power generation device, according to one embodiment.
Figure 2:
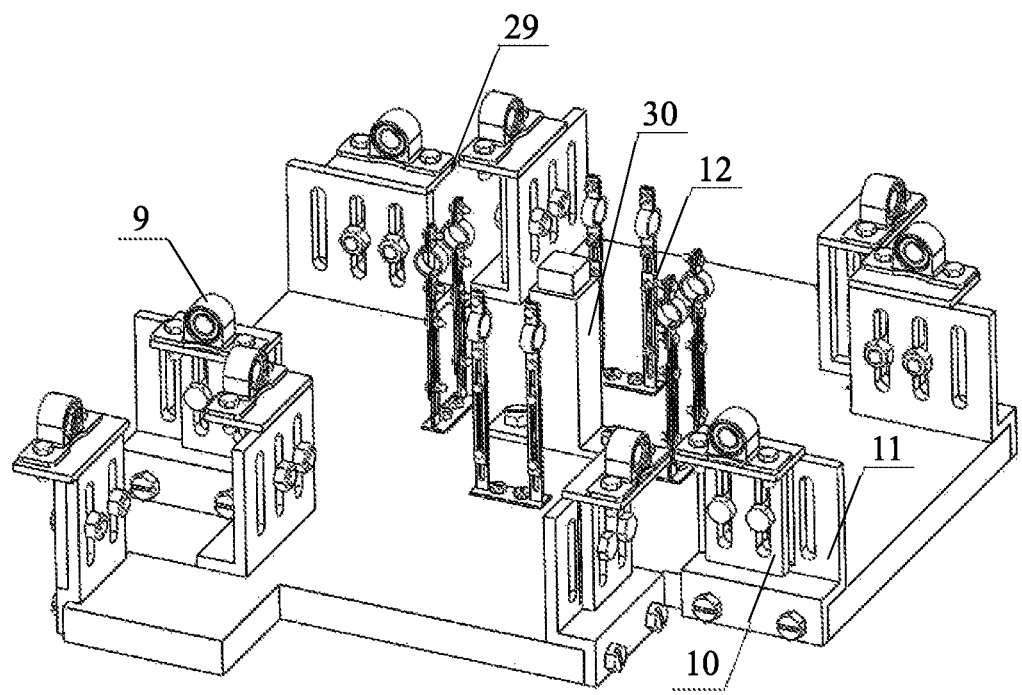
FIG. 2 is a schematic structural view of a fixed frame; according to one embodiment.
Figure 3:
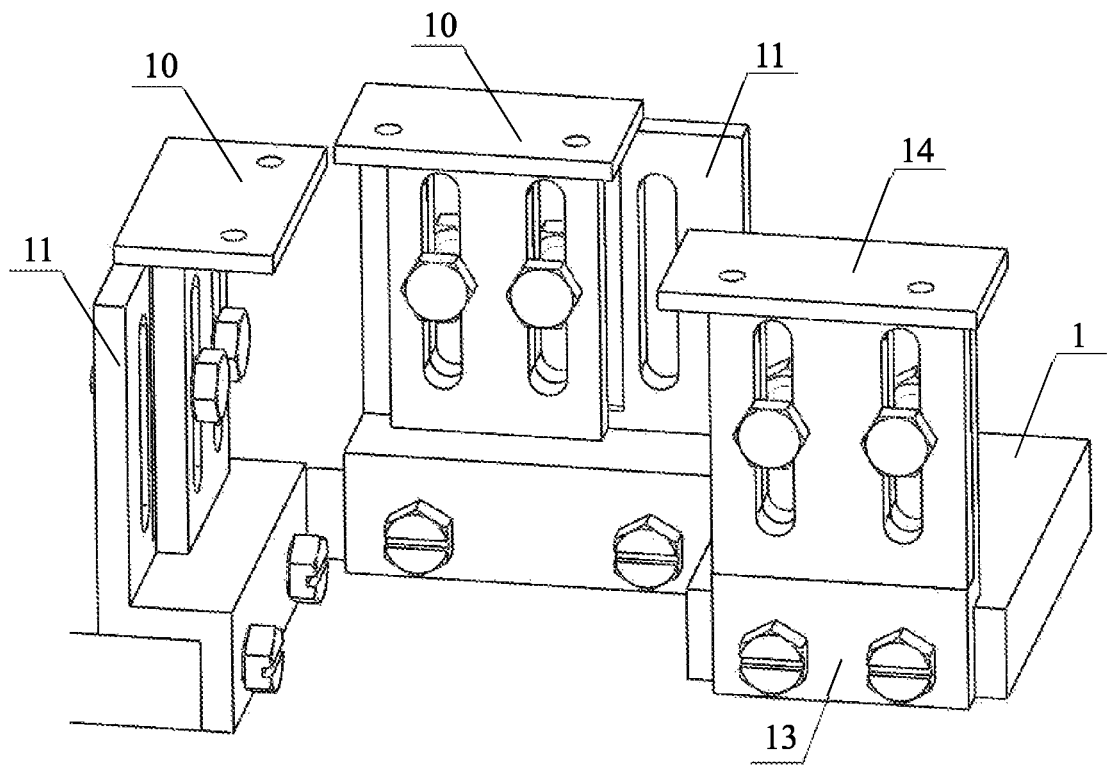
FIG. 3 is a schematic structural view of the lifting support frame 29; according to one embodiment.
Figure 4:
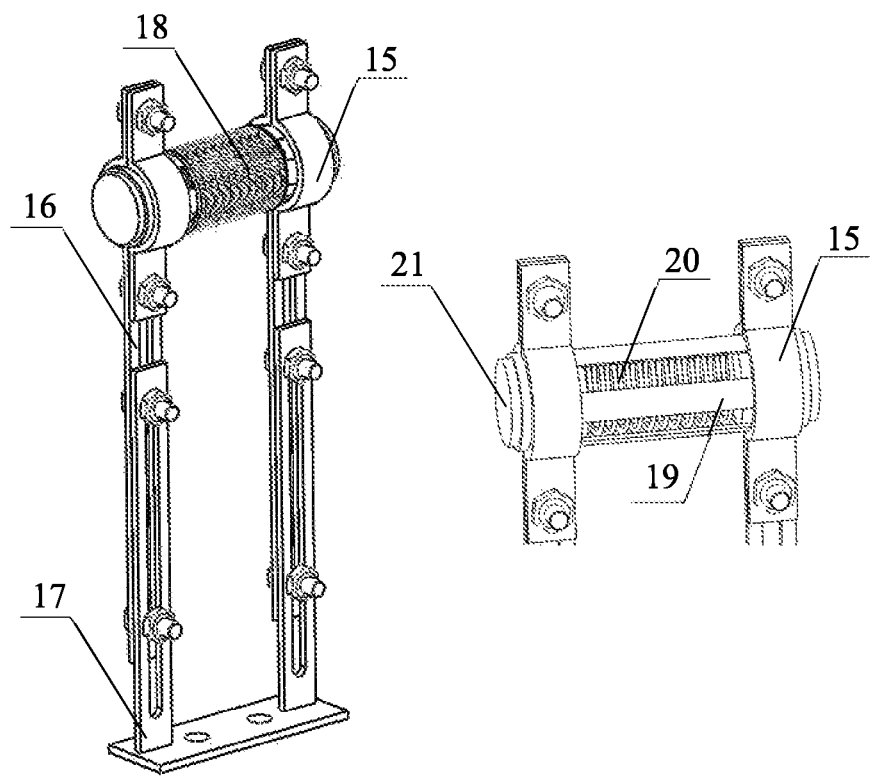
FIG. 4 is a schematic structural view of an electromagnetic induction power generating device and a support frame thereof, according to one embodiment.
Figure 5:
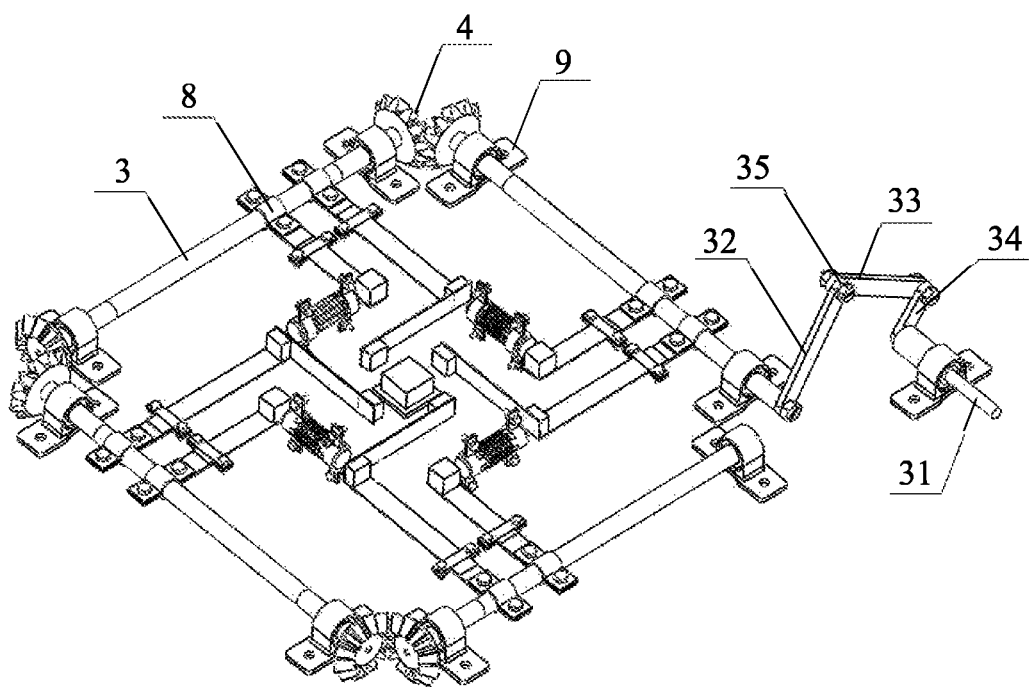
FIG. 5 is a schematic structural view of a piezoelectric beam swinging mechanism, according to one embodiment.
Figure 6:
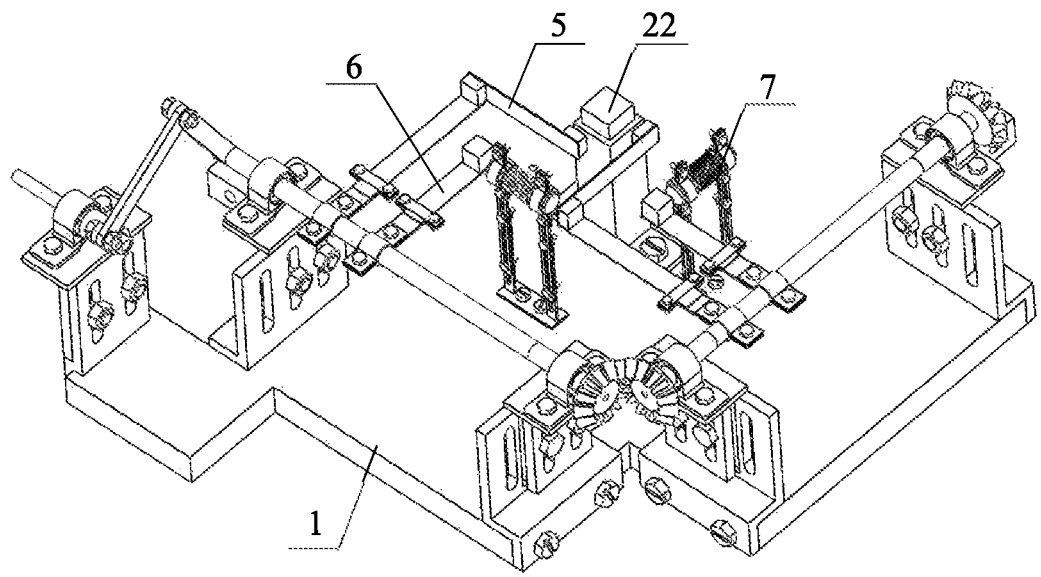
FIG. 6 is a partial structural diagram of a four-sided-synchronous-swing dual-mode broadband power generation device, according to one embodiment.
Figure 7:
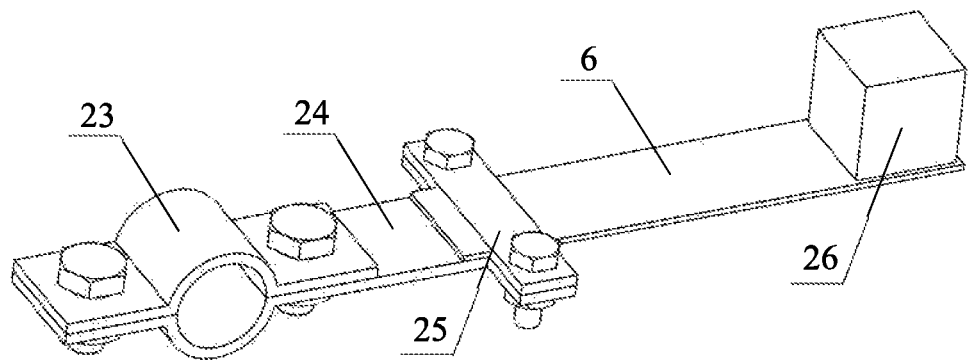
FIG. 7 is a schematic structural view of a straight piezoelectric beam component, according to one embodiment.
Figure 8:
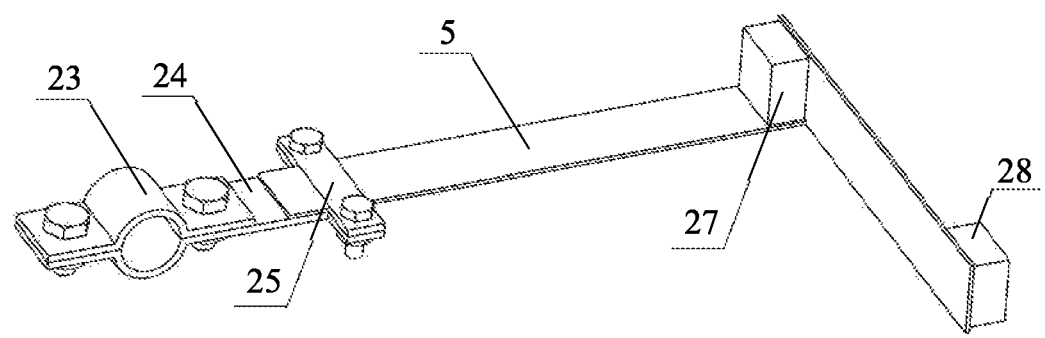
FIG. 8 is a schematic structural view of an L-shaped piezoelectric beam component, according to one embodiment.
Figure 9:
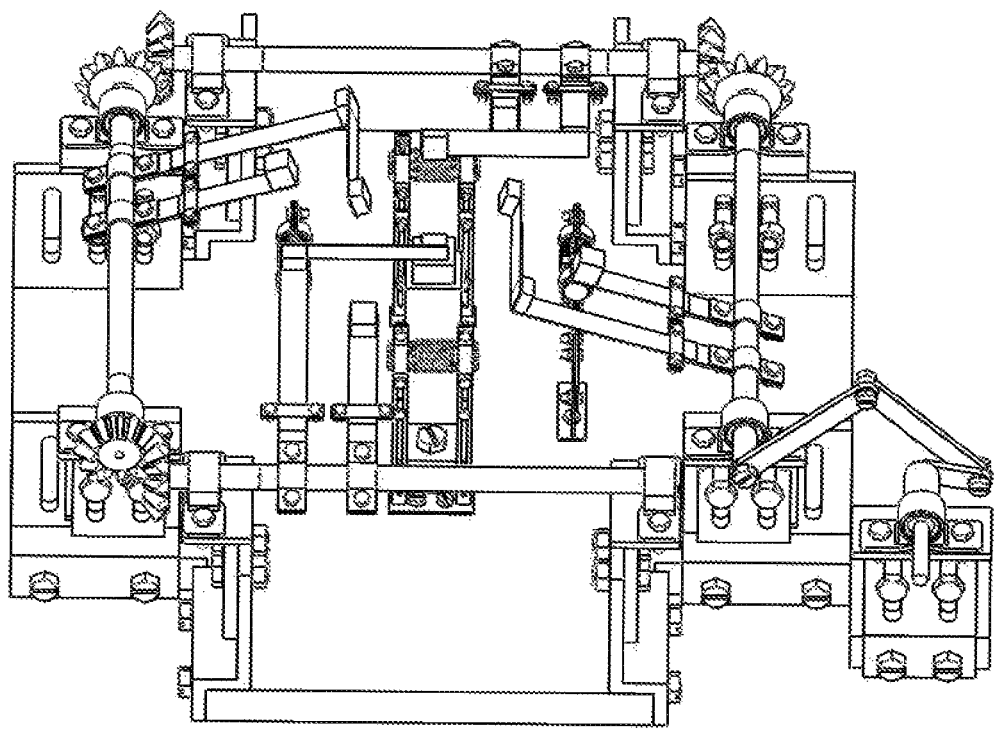
FIG. 9 is a schematic view showing the overall structure of a four-sided synchronous swing dual-mode broadband power generation device swinging above a horizontal position, according to one embodiment.
Figure 10:
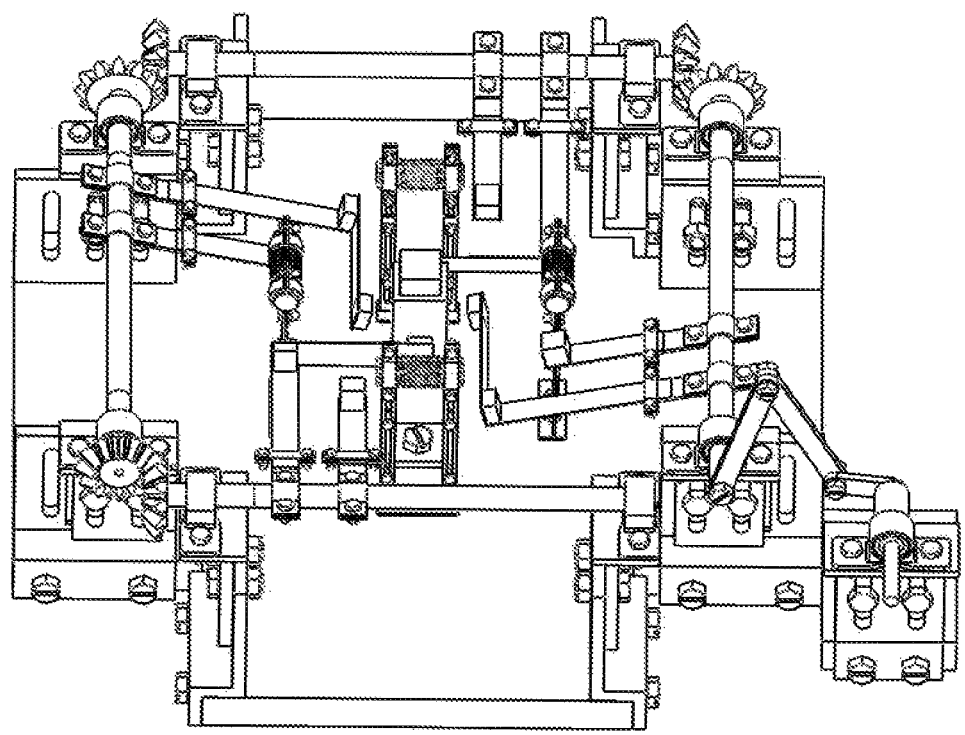
FIG. 10 is a schematic view showing the overall structure of a four-sided synchronous-swing dual-mode broadband power generation device swinging below a horizontal position, according to one embodiment.
Figure 11:
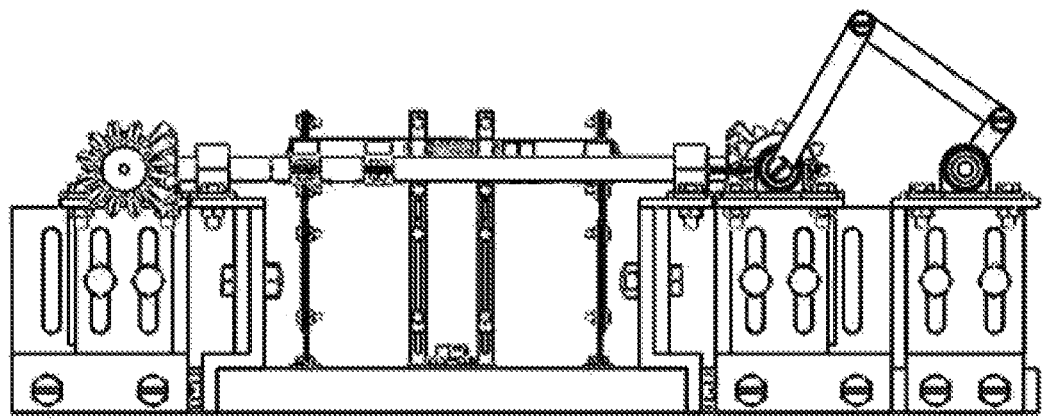
FIG. 11 is a front elevational view of a four-sided-synchronous-swing dual-mode broadband power generation device, according to one embodiment.
Figure 12:
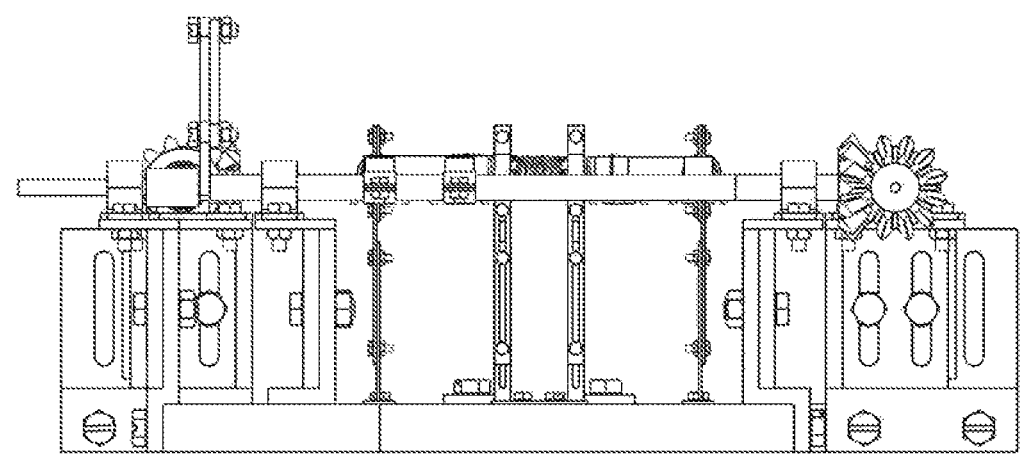
FIG. 12 is a right side elevational view of a four-sided-synchronous-swing dual-mode broadband power generation device, according to one embodiment.

As shown in FIGS. 1-12, the present invention is a four-sided-synchronous-swing dual mode wideband power generating device which is composed of a fixed frame, a piezoelectric beam swinging mechanism and an electromagnetic induction power generating device 7. The invention combines piezoelectric and electromagnetic power generation methods to convert the rotating energy in the environment into the oscillation of piezoelectric cantilever beam. When the piezoelectric cantilever beam is oscillated at a high frequency, the piezoelectric beam is deformed by positive piezoelectric effect for power generation. Since the straight piezoelectric beam end magnet 26, the L beam magnet a 27 and the spring end magnet 21 repel each other, the swing of piezoelectric cantilever causes the spring end magnet 21 to reciprocate inside the sleeve 19, and magnetic flux passing through the coil 18 changes. Thereby, an induced electromotive force is generated to generate electricity.

The fixed frame is composed of a base 1, a lifting support frame 29, an electromagnetic induction power generation device support frame 12, and a central magnet fixing platform 30. Wherein, the lifting support frame 29 is composed of two parts, and the part supporting the gear shaft 3 is composed of a lifting platform 10 and a bottom platform connector 11, and is respectively installed on the four corners of the base 1. The lifting platform 10 and bottom platform connector 11 are fixed by bolts. The lifting platform 10 and the bottom platform connector 11 have through slot, distance between lifting platform 10 and the base 1 and the center magnet 22 can be adjusted for installing different sizes piezoelectric cantilever beams and adjusting the swinging amplitude of piezoelectric cantilever beam. The portion supporting the input shaft 31 is constituted by a rotating shaft supporting platform 13 and a rotating shaft lifting platform 14, the rotating shaft supporting platform 13 and rotating shaft lifting platform 14 are fixed by bolts. Rotating shaft support platform 13 and rotating shaft lifting platform 14 have through slot for adjusting the distance between the rotating shaft lifting platform 14 and base 1. The bottom platform connector 11, the rotating shaft supporting platform 13 and base 1 are both fixed by bolts. The lifting platform 10, the rotating shaft lifting platform 14 and the bearing 9 are connected by bolts. Electromagnetic induction power generation device support frame 12 is composed of a sleeve pressing piece 15, a sleeve lifting bracket 16, and an electromagnetic induction power generating device fixing bracket 17. The electromagnetic induction power generation device fixing bracket 17 and base 1 are fixed by bolts. The sleeve lifting bracket 16 and electromagnetic induction power generating device fixing bracket 17 have a through slot and are fixed by bolts. The sleeve lifting bracket 16 can slide on the electromagnetic induction power generating device fixing bracket 17, the height (elevation) of the spring end magnet 21, the straight beam end magnet 26 and the L beam magnet a 27 is maintained same. The sleeve lifting bracket 16 and sleeve pressing piece 15 are connected by bolts and clamp the sleeve 19. The central magnet fixing platform 30 and base 1 are fixed by bolts. The height of the center magnet 22 is adjusted by adding a spacer.

The piezoelectric beam swinging mechanism is composed of a crank rocker mechanism 2, a piezoelectric beam component, a bearing 9, and a gear component. The crank rocker mechanism 2 is composed of a crank 32, a link 33 and a rocker 34. The crank 32 is coupled to the gear shaft 3 by bolts; the rocker 34 is coupled to the input shaft 31 by bolts; and the link 33 is coupled to the crank 32 and the rocker 34 by the bolt sleeves 35. The crank rocker mechanism 2 can convert the rotation of input shaft 31 into the swing of gear shaft 3, thereby causing the piezoelectric cantilever to vibrate. The piezoelectric beam component is composed of a piezoelectric beam clamp, a straight piezoelectric beam 6, an L-shaped piezoelectric beam 5, and a permanent magnet. The piezoelectric beam clamp is composed of a piezoelectric beam clamp upper clamp plate 23, a piezoelectric beam clamp lower clamp plate 24, and a piezoelectric beam clamp 25. The piezoelectric beam clamp upper clamp plate 23 and the piezoelectric beam clamp lower clamp plate 24 are connected by bolts and fixed to the gear shaft 3, and can be swung together with the gear shaft 3. The piezoelectric beam clip 25 is connected to the piezoelectric beam clamp lower clamp plate 24 by a bolt for clamping the piezoelectric cantilever beam. The base material of L-shaped piezoelectric beam 5 and the straight piezoelectric beam 6 is brass, and the piezoelectric layer material is PZT. The electrical energy generated by the vibration of each piezoelectric cantilever beam is drawn through two wires, one wire connected to the brass layer and the other wire connected to the PZT piezoelectric layer. The permanent magnet includes a straight beam end magnet 26, an L beam magnet a 27, and an L beam magnet b 28. The permanent magnet is bonded to the piezoelectric beam to reduce the natural frequency of piezoelectric cantilever beam and increase the amplitude of piezoelectric cantilever beam, thereby improving the power generation capability of the system. Bearing 9 connects gear shaft 3 and input shaft 31, can effectively reduce the resistance when gear shaft 3 and input shaft 31 rotate, and reduce energy loss. Bearing 9 is connected to the lifting platform 10 and the rotating shaft lifting platform 14 by bolts. The gear component is composed of a gear shaft 3 and a bevel gear 4. Gear shaft 3 and the bevel gear 4 are connected by a key, and the gear shaft 3 is mounted on the lifting platform 10 via a bearing 9. The four gear shafts 3 connected to the crank 32 are all swung with the crank 32.

The electromagnetic induction power generating device 7 is composed of a coil 18, a sleeve 19, a spring 20, and a spring end magnet 21. The coil 18 is a copper enameled wire. The sleeve 19 is fixed to the sleeve lifting bracket 16 by a sleeve pressing piece 15. The intermediate portion of the spring 20 is fixed to the inner wall of the sleeve 19. The spring end magnet 21 is bonded and fixed to both ends of the spring 20. The spring end magnet 21 is repelled by the straight beam end magnet 26 and L beam magnet a 27, and reciprocates inside sleeve 19, the magnetic flux passing through the coil 18 constantly changes to generate an induced electromotive force.

In summary, the four-sided-synchronous-swing dual-mode broadband power generation device adopts a reasonable layout manner, reduces the working space, and conforms to the development of micro-electromechanical technology. The invention can input the energy in the environment in a rotating form, and convert it into an output in a swing form by crank rocker mechanism 2, and adjacent straight piezoelectric beam 6, the L-shaped piezoelectric beam 5 and the electromagnetic induction power generating device 7 are composed. Four sets of dual-mode piezoelectric electromagnetic composite power generation structures effectively improve the power generation performance of the structure. The invention does not require an external power supply and can be applied to the field of wireless technology to power wireless electronic devices. The input shaft 31 of the inventive device can be coupled to the axle of the bicycle, and can be powered by the rotation of the wheel axle to power electronic equipment such as lighting and positioning of the bicycle. The invention can also be applied to fields such as wind power generation and hydropower generation. The L-shaped piezoelectric beam 5 of the invention is composed of a horizontal beam and a vertical beam, and can realize vibration in two directions, so that the dynamic behavior of the piezoelectric cantilever beam swing is richer and more complicated, and the straight piezoelectric beam 6 different from the length of the two parts of L-shaped piezoelectric beam 5, the energy of different oscillation frequencies can be effectively collected, the effective working bandwidth is widened, and the power generation capability of the system is improved.

What is claimed is:
1. A four-sided-synchronous-swing dual-mode broadband power generation device, comprising:
  a fixed frame; further comprising:
    a base (1);
    a lifting support frame (29); further comprising:
      four supporting gear shafts (3); each further comprising:
        a lifting platform (10); and
        a bottom platform connector (11); and
      a supporting input shaft (31); further comprising:
        a rotating shaft supporting platform (13); and
        a rotating shaft lifting platform (14),
    an electromagnetic induction power generation device support frame (12); further comprising:
      a sleeve pressing piece (15);
      a sleeve lifting bracket (16); and
      an electromagnetic induction power generating device fixing bracket (17); and
    a central magnet fixing platform (30) with a center magnet (22);
  a piezoelectric beam swinging mechanism; further comprising:
    a crank rocker mechanism (2); further comprising
      a crank (32), a link (33) and a rocker (34);
    a piezoelectric beam component; further comprising
      a piezoelectric beam fixture; further comprising:
        a piezoelectric beam clamp upper clamp plate (23);
        a piezoelectric beam clamp lower clamp plate (24); and
        a piezoelectric beam clip (25);
      a straight piezoelectric beam (6);
      a L-shaped piezoelectric beam (5); and
      a permanent magnet; further comprising:
        a straight beam end magnet (26);
        a L beam magnet a (27); and
        a L beam magnet b (28);
    a bearing (9); and
    a gear component; further comprising
      a gear shaft (3); and
      a bevel gear (4); and
  an electromagnetic induction power generating device (7); further comprising:
    a coil (18);
    a sleeve (19);
    a spring (20); and
    a spring end magnet (21);
  wherein the bottom platform connectors (11) are respectively installed at the four corners of the base (1);
  wherein the lifting platform (10) is fixed to the bottom platform connector (11) by bolts; wherein a first through slot is provided on the lifting platform (10) and the bottom platform connector (11), and is configured to adjust the distance between the lifting platform (10) and the base (1), and is configured to adjust the distance between the lifting platform (10) and the center magnet (22), to accommodate different sizes of piezoelectric cantilever beams and to adjust the swing amplitude of the piezoelectric cantilever;
  wherein the rotating shaft supporting platform (13) is fixed to rotating shaft lifting platform (14) by bolts; wherein a second through slot is provided on the rotating shaft support platform (13) and the rotating shaft lifting platform (14), and is configured to adjust the distance between the rotating shaft lifting platform (14) and base (1);
  wherein the bottom platform connector (11) and the base (1) are fixed by bolts, and the rotating shaft supporting platform (13) and base (1) are fixed by bolts;
  wherein the lifting platform (10), the rotating shaft lifting platform (14) and the bearing (9) are connected by bolts;
  wherein an electromagnetic induction power generating device fixing bracket (17) and the base (1) are fixed by bolts; wherein the sleeve lifting bracket (16) and electromagnetic induction power generating device fixing bracket (17) are fixed by bolts; wherein a third through slot is provided on the sleeve lifting bracket (16) and the electromagnetic induction power generating device fixing bracket (17), to allow the sleeve lifting bracket (16) to slide on the electromagnetic induction power generating device fixing bracket (17), in order to maintain the same height for the spring end magnet (21), straight beam end magnet (26) and the L beam magnet a (27);

wherein the sleeve lifting bracket (16) and sleeve pressing piece (15) are connected by bolts and clamp the sleeve (19);

wherein the central magnet fixing platform (30) and the base (1) are fixed by bolts;

wherein the height of the center magnet (22) is adjusted by adding spacers;

wherein the crank (32) connects the gear shaft (3);

wherein the rocker (34) is coupled to the input shaft (31);

wherein one end of the crank (32) and the link (33), and the other end of the link (33) and the rocker (34) are both connected by bolt and bolt sleeve (35);

wherein the crank rocker mechanism (2) is configured to convert the rotation of the input shaft (31) into swings of the gear shaft (3), thereby causing the piezoelectric cantilever to vibrate for power generation;

wherein the piezoelectric beam clamp upper clamp plate (23) and the piezoelectric beam clamp lower clamp plate (24) are bolted and fixed to the gear shaft (3), and the piezoelectric beam clamp upper clamp plate (23) and the piezoelectric beam clamp lower clamp plate (24) are configured to swing with the gear shaft (3);

wherein the piezoelectric beam clip (25) and the piezoelectric beam clamp lower clamp plate (24) are connected by bolts and configured to clamp the piezoelectric cantilever;

wherein the permanent magnet is bonded to the piezoelectric cantilever beam to reduce the natural frequency of piezoelectric cantilever beam and increase the amplitude of piezoelectric cantilever beam, thereby increasing the power generation capability of the device;

wherein the bearing (9) is connected to the gear shaft (3) and the input shaft (31), and configured to reduce the resistance of the gear shaft (3) and the input shaft (31) in rotation;

wherein the bearing (9) and the lifting platform (10) and the rotating shaft lifting platform (14) are connected by bolts;

wherein the gear shaft (3) and the bevel gear (4) is connected by keys;

wherein the gear shaft (3) is mounted on the lifting platform (10) through the bearing (9);

wherein the all four gear shafts (3) connected to the crank (32) are configured to oscillate with the crank (32);

wherein the sleeve (19) is fixed on the sleeve lifting bracket (16) by the sleeve pressing piece (15);

wherein the middle portion of the spring (20) is fixed on the inner wall of the sleeve (19); and wherein the spring end magnet (21) is fixed to both ends of the spring (20), and is configured to be repelled by the straight beam end magnet (26) and L beam magnet a (27) to reciprocate inside the sleeve (19) to cause the magnetic flux passing through the coil (18) to change continuously, thereby generating an induced electromotive force.

2. The four-sided-synchronous-swing dual-mode broadband power generating apparatus according to claim 1, wherein the base of the L-shaped piezoelectric beam (5) and the base of the straight piezoelectric beam (6) are brass, and the piezoelectric layer material is PZT.

3. The four-sided-synchronous-swing dual-mode broadband power generating apparatus according to claim 1, wherein the electric energy generated by the vibration of each piezoelectric cantilever beams is led out through two wires, one wire is connected to a brass layer, and the other is connected to a PZT piezoelectric layer.

4. The four-sided-synchronous-swing dual-mode broadband power generating apparatus according to claim 1, wherein the coil (18) comprises a copper enameled wire.

* * * * *